United States Patent
Moon

Patent Number: 5,892,791
Date of Patent: Apr. 6, 1999

[54] HIGH-SPEED VARIABLE LENGTH DECODING APPARATUS

[75] Inventor: Heon-Hee Moon, Suwon, Rep. of Korea

[73] Assignee: Samsung Electronics Co., Ltd., Kyungki-do, Rep. of Korea

[21] Appl. No.: 735,075

[22] Filed: Oct. 18, 1996

[30] Foreign Application Priority Data

Oct. 19, 1995 [KR] Rep. of Korea .................. 1995-36148

[51] Int. Cl.⁶ .............................. G06F 11/10; H04N 7/12
[52] U.S. Cl. ............................................ 375/341; 348/419
[58] Field of Search ..................... 375/262, 246, 375/372, 340, 341, 253, 241; 341/65; 348/419, 405, 406, 384, 390; 370/477

[56] References Cited

U.S. PATENT DOCUMENTS

| | | | |
|---|---|---|---|
| 4,355,306 | 10/1982 | Mitchell | 358/261.2 |
| 5,253,078 | 10/1993 | Balkanski et al. | 358/426 |
| 5,379,284 | 1/1995 | Kim | 369/44.32 |
| 5,710,595 | 1/1998 | Hang et al. | 348/419 |

FOREIGN PATENT DOCUMENTS

| | | |
|---|---|---|
| 0493086 | 7/1992 | European Pat. Off. . |
| 0499225 | 8/1992 | European Pat. Off. . |
| 0629050 | 12/1994 | European Pat. Off. . |
| 0681404 | 11/1995 | European Pat. Off. . |
| 61-107818 | 5/1986 | Japan . |

*Primary Examiner*—Chi H. Pham
*Assistant Examiner*—Kim T. Nguyen
*Attorney, Agent, or Firm*—Sughrue, Mion, Zinn, Macpeak & Seas, PLLC

[57] ABSTRACT

A high-speed variable length decoding apparatus independently generates a run-level symbol and decodes the run-level symbol, to thereby variable length decode the variable length coded data at high frequency for signal processing. The variable length decoding apparatus includes a storage and output portion for storing the variable length coded data and outputting the stored variable length coded data by a predetermined data amount in response to a data storage state signal, a run-level table for outputting a run-level symbol which is determined by the data output from the storage and output portion, a memory for storing and outputting the run-level symbol output from the run-level table, in a first-in-first-out manner, and generating the signal indicating a data storage state of its own, and a run-level decoder for run-level decoding the run-level symbol output from the memory.

10 Claims, 4 Drawing Sheets

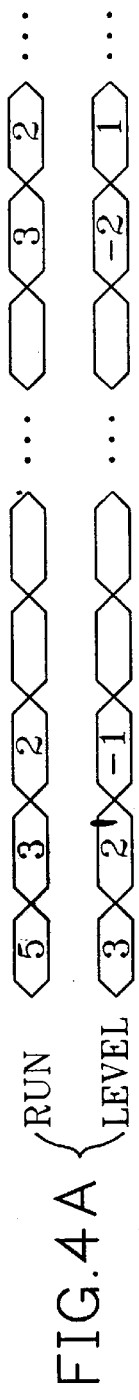
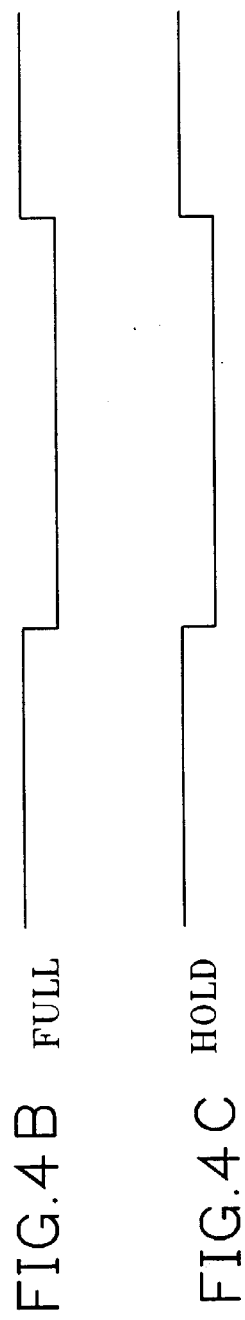
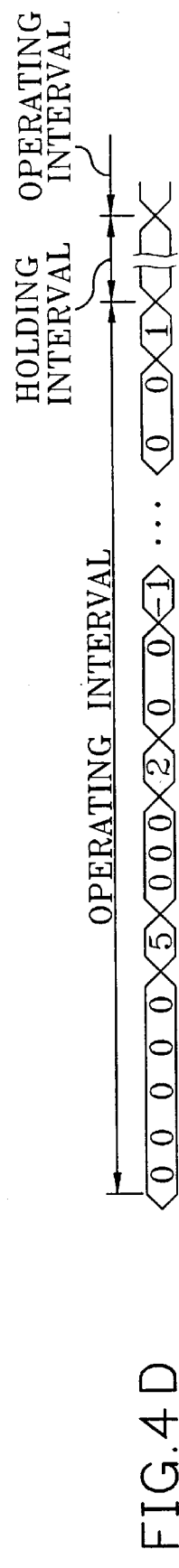
FIG.4A {RUN, LEVEL}
FIG.4B FULL
FIG.4C HOLD
FIG.4D OPERATING INTERVAL / HOLDING INTERVAL / HOLDING INTERVAL / OPERATING INTERVAL
FIG.4E EMPTY

HIGH-SPEED VARIABLE LENGTH DECODING APPARATUS

BACKGROUND OP THE INVENTION

The present invention relates to a decoding apparatus for decoding variable-length coded data, and more particularly, to a high speed variable length decoding apparatus which can enhance processing speed for variable length decoding in a data transmission system which performs signal processing at high frequency.

Generally, systems such as high-definition TVs, high-definition VCRs, digital VCRs, digital camcorders and multimedia equipment, digitally process video and audio information and record or transmit the digitally processed information. The methods which have been proposed for digitally processing video information are prediction coding, orthogonal transform coding, and variable length coding. A typical coding system using these coding techniques performs orthogonal transform coding, quantization and variable length coding with respect to blocks obtained by video partition, in order to effectively compress video information. Also, such a system performs interframe or interfield prediction coding to further increase the data compression rate.

The above-described variable length coding the data compression rate.

The above-described variable length coding apparatus, which compresses information based on frequencies of occurrence of symbols, includes a VLC code table for variable length coding the input symbols. The VLC code table is developed using the Huffman coding technique. As is well known, Huffman coding assigns a shorter code to a symbol having a relatively higher frequency of occurrence and assigns a longer code to a symbol having a relatively lower frequency of occurrence. In the typical coding system, symbols input to the variable length coding apparatus are [run, level] symbols which are generally obtained by run-length coding. The [run, level] symbols are obtained by a well-known zigzag scan, in which "run" represents the number of successive zeros existing between transformation coefficients which are not zero, and "level" represents a value of the transformation coefficient which is not zero. The variable length coding table designed by the Huffman coding technique is divided into an escape region for symbols in which either "run" or "level" has a relatively very large value and a regular region for the other symbols. Codes in the regular region are assigned to the [run, level] symbols according to the Huffman coding technique. Meanwhile, since the [run, level] symbols in the escape region statistically have an extremely low frequency of occurrence, an "ESC code" indicating the [run, level] symbol of the escape region together with a relatively long code is assigned to the [run, level] symbols, respectively. Codewords generated by the variable length coding are transmitted to a decoding system in the form of a bitstream which includes additional information such as an ESC code and an end-of-block (EOB) code indicating a block end.

The decoding system includes a variable length decoder, an inverse quantizer, and an inverse orthogonal transformer, which are used to decode the coded data by performing a reverse procedure of signal processing of the coding system. Referring to FIG. 1 which shows an existing variable length decoding apparatus, variable length coded data is input to a first-in-first-out (FIFO) memory 11 in the form of a serial or parallel bitstream. The FIFO memory 11 stores the input variable length coded data, and outputs the earliest input bit data among the stored data to an interfacer 12 whenever a read signal READ is applied from the interfacer 12. The interfacer 12 separates the data output from the FIFO memory 11 into the variable length coded data and the other additional data based on a start code contained in the data output from the FIFO memory 11. The interfacer 12 outputs data having a predetermined number of bits, for example, 32-bit data, to a barrel shifter 14 in response to a data request signal RQST output from the barrel shifter 14.

The barrel shifter 14 shifts a window of a predetermined size by a code length applied from a code table 15, and outputs data in the shifted window to a [run, level] table 15 and the code table 16. The [run, level] table 16 outputs a [run, level] symbol corresponding to a code contained in the data applied from the barrel shifter 14 to a [run, level] decoder 17. The code table 15 uses the data applied from the barrel shifter 14 and outputs a code length corresponding to the [run, level] symbol output from the [run, level] table 16 to the barrel shifter 14. The barrel shifter 14 outputs the bit data in the window, which has been shifted by the newly applied code length, to the [run, level] table 16 and the code table 15. The barrel shifter 14, the [run, level] table 16 and the code table 15 repeat the above operation to perform variable length decoding with respect to the data supplied from the interfacer 12.

A sequence controller 13 interrupts the operations of the interfacer 12 and the barrel shifter 14 and resumes the interrupted operations. For this purpose, the sequence controller 13 generates a start signal START or an interrupt signal HOLD in response to parameters obtained from an external control input and the data output from the barrel shifter 14. These signals START and HOLD are applied to the interfacer 12 and the barrel shifter 14.

The [run, level] decoder 17 decodes [run, level] symbols applied from the [run, level] table 16 and outputs the decoded [run, level] symbols to an inverse quantizer (IQ) (not shown) and an inverse orthogonal transformer such as an inverse discrete cosine transformer (IDCT) (not shown). Here, the operational timing diagrams of the [run, level] decoder 17 are shown in FIGS. 2A through 2C. When [run, level] symbols generated from the [run, level] table 16 are [5, 3], [3, 2], . . . , the [run, level] decoder 17 generates zeros of the data of the run-length with respect to the input [run, level] symbol and the following level as shown in FIG. 2A, on the basis of the clock pulses shown in FIG. 2B which are generated at a constant clock rate. That is, five zeros are output with respect to the [run, level] symbol [5, 3], and then the level value of 3 is output. Then, three zeros are output with respect to the [run, level] symbol [3, 2], and then the level value of 2 is output. In this case, the [run, level] decoder 17 generates a low-level interruption signal HOLDA which interrupts the operation of the barrel shifter 14 during generation of the clock pulses of the number consistent with the runlength. That is, the interruption signal HOLDA of FIG. 2C is generated so that the barrel shifter 14 interrupts the shift operation during generation of the clock pulses of the runlength of 5 with respect to the [run, level] symbol [5, 3]. Also, the interruption signal HOLDA of FIG. 2C is generated so that the barrel shifter 14 interrupts the shift operation during generation of the clock pulses of the runlength of 3 with respect to the [run, level] symbol [3, 2].

However, in the above-described existing variable length decoding apparatus, the operation of the barrel shifter 14 is interrupted while zeros from the [run, level] decoder 17 are successively outputted. Therefore, the existing variable length decoding apparatus can be used only in a system whose operational speed is not high. Thus, it is difficult to use the existing variable length decoding apparatus in a high speed system such as an HDTV system which should decode more symbols per unit time.

SUMMARY OF THE INVENTION

To solve the above problem, it is an object of the present invention to provide a high-speed variable-length decoding apparatus which independently performs a generation operation of a [run, level] symbol and a decoding operation of the [run, level] symbol, to thereby overcome a time delay which results from an interruption in the operation of a barrel shifter portion for a run-length interval.

To accomplish the above object of the present invention, there is provided a variable length decoding apparatus for decoding variable length coded data, the variable length decoding apparatus comprising:

- a storage and output portion for storing the variable length coded data and outputting the stored variable length coded data by a predetermined data amount in response to a data storage state signal;
- a [run, level] table for outputting a [run, level] symbol which is determined by the data output from the storage and output portion;
- a memory for storing and outputting the [run, level] symbol output from the [run, level] table, in a first-in-first-out manner, and generating the signal indicating a data storage state of its own; and
- a [run, level] decoder for run-level decoding the [run, level] symbol output from the memory.

BRIEF DESCRIPTION OF THE DRAWINGS

The preferred embodiments are described with reference to the drawings wherein:

FIGS. 4A through 4E are timing diagrams for explaining the operation of the FIG. 3 apparatus.

DETAILED DESCRIPTION OF THE PREFERRED EMBODIMENT

A preferred embodiment of the present invention will be described below in more detail with reference to the accompanying drawings.

Figure 1:
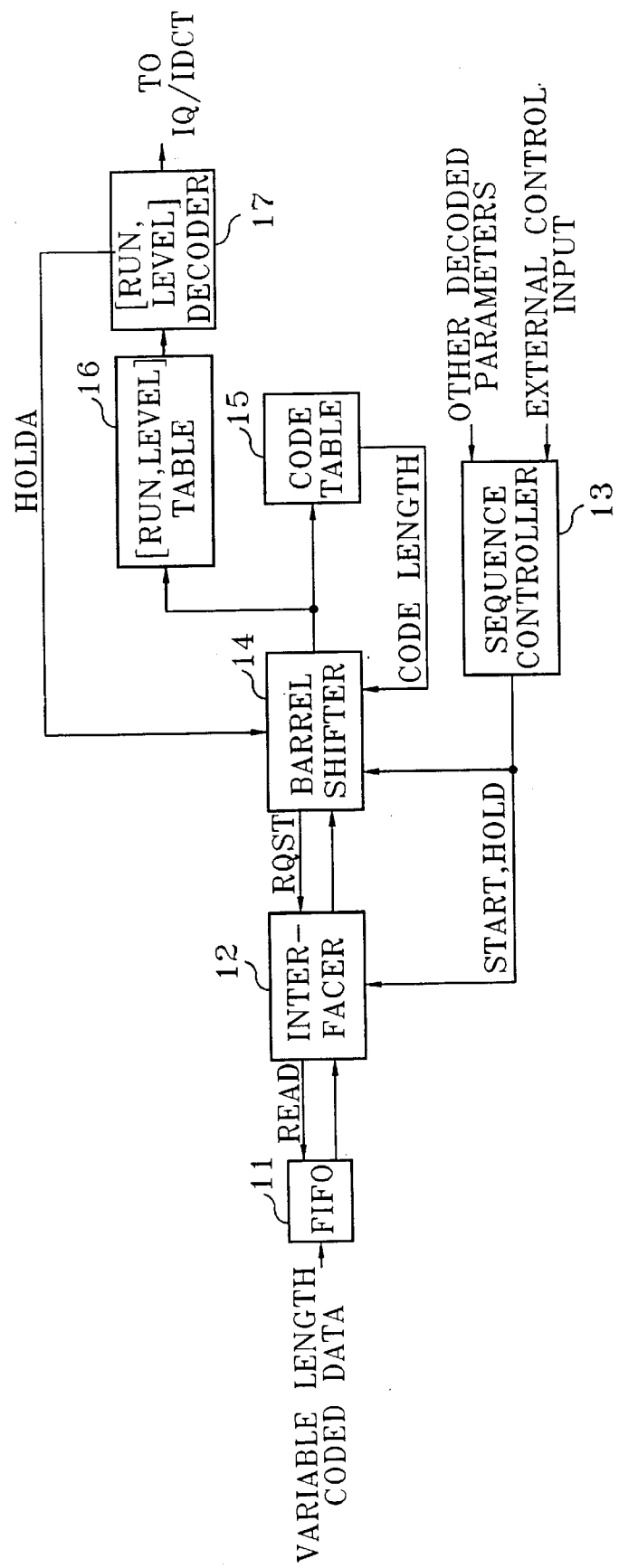
FIG. 1 is a block diagram of a conventional variable length decoding apparatus.
Figure 2:
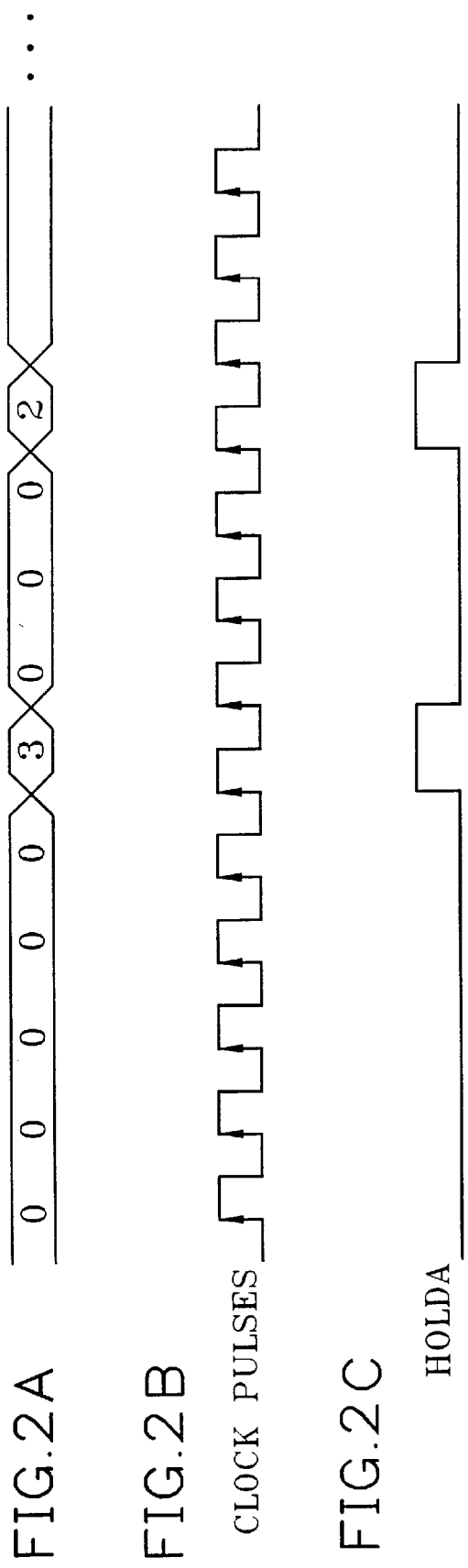
FIGS. 2A through 2C are timing diagrams for explaining the operation of the FIG. 1 apparatus.
Figure 3:
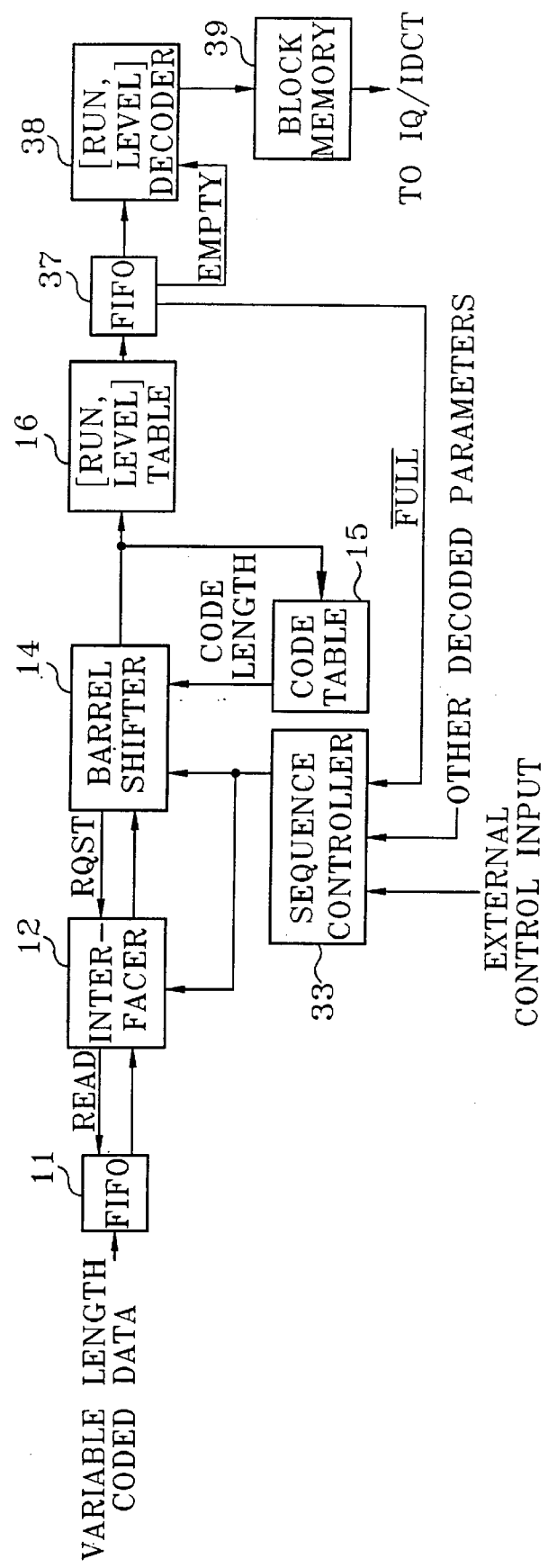
FIG. 3 is a block diagram of a high speed variable length decoding apparatus according to a preferred embodiment of the present invention.

The FIG. 3 apparatus includes blocks which perform the same functions as corresponding blocks of the FIG. 1 apparatus. These blocks have the same reference numerals as those of the FIG. 1 apparatus. The FIG.3 apparatus according to the present invention additionally includes a second FIFO memory 37, inserted between a [run, level] table 16 and a [run, level] decoder 38, for storing [run, level] symbols, a sequence controller 33 for controlling the operations of an interfacer 12 and a barrel shifter 14 according to the data storage state of the second FIFO memory 37, and a block memory 39 for storing the run-level decoded data output from the [run, level] decoder 38 in units of a block.

A first FIFO memory 11 stores the variable length coded data in the form of a serial or parallel bitstream, and outputs the earliest input data among the stored data to the interfacer 12, whenever a read signal READ is applied from the bitstream interfacer 12 thereto. The interfacer 12 outputs a read signal READ to the first FIFO memory 11 whenever a data request signal RQST is applied from the barrel shifter 14 thereto. The interfacer 12 also arranges the variable length coded data output from the first FIFO memory 11, which is output in response to the data request signal RQST, on the basis of a start code indicating a start of an interval contained in the variable length coded data. If the arranged variable length coded data is supplied from the interfacer 12, the barrel shifter 14 outputs the variable length coded data in the window shifted by the code length applied from the code table 15, to the code table 15 and the [run, level] table 16. The [run, level] table 16 outputs the [run, level] symbol corresponding to a codeword in the variable length coded data applied from the barrel shifter 14.

Meanwhile, the code table 15 outputs, to the barrel shifter 14, the code length possessed by the codeword in the variable length coded data applied from the barrel shifter 14. The code length is a length of a codeword corresponding to the [run, level] symbol obtained by variable length decoding the same variable length coded data. The barrel shifter 14 shifts a window of a predetermined size by a code length which is newly applied from the code table 15, and outputs the variable length coded data in the shifted window to the [run, level] table 16 and the code table 15. The barrel shifter 14, the [run, level] table 16 and the code table 15 repeat the above processing steps. The data which is not used for the variable length decoding is repeatedly output from the barrel shifter 14 until a corresponding [run, level] symbol is determined by the code table 15. Since the operation of the barrel shifter 14 is well known to one skilled in the art, the detailed description thereof will be omitted.

The second FIFO memory 37 stores the [run, level] symbol output from the [run, level] table 16 and supplies the stored [run, level] symbol to the [run, level] decoder 38, in its input sequence. The FIFO memory 37 outputs a fullness signal (/FULL) to the sequence controller 33 when the data storage state indicates that the FIFO memory 37 is full of data. The sequence controller 33 interrupts the operations of the interfacer 12 and the barrel shifter 14 or resumes the interrupted operations. That is, the sequence controller 33 receives the fullness signal (/FULL), an external control input and other parameters decoded via a variable decoder (not shown) and applies a start signal START or an interrupt signal HOLD to the interfacer 12 and the barrel shifter 14. The sequence controller 33 responding to the fullness signal (/FULL) generates the HOLD signal when the second FIFO memory 37 is full of data. The HOLD signal is supplied to the interfacer 12 and the barrel shifter 14. The interfacer 12 and the barrel shifter 14 responding to the HOLD signal operate so that the variable length coded data is not output from the barrel shifter 14. Under the control of the sequence controller 33 responding to the fullness signal (/FULL), the second FIFO memory 37 can store all the [run, level] symbols output from the [run, level] table 16. Thus, a problem of losing the [run, level] symbols due to an overflow of the second FIFO memory 37 can be prevented.

The second FIFO memory 37 outputs an empty signal EMPTY, indicating that the data storage state is empty, to the [run, level] decoder 38 when the second FIFO memory 37 is emptied. In other words, the second FIFO memory 37 generates an empty signal when there is no data to be output. The [run, level] decoder 38 does not perform a run-level decoding operation during the time when the EMPTY signal is applied, that is, when there is no data output from the second FIFO memory 37. However, during the time when the signal is not applied, the [run, level] decoder 38 run-level-decodes the [run, level] symbol applied from the [run, level] table 16 via the second FIFO memory 37, and outputs the run-level-decoded data to the block memory 39. According to the operations of the second FIFO memory 37 and the [run, level] decoder 38, an incorrect run-level decoding operation can be prevented. The [run, level] symbols output from the [run, level] table 16 can be run-level-decoded without any delay, as well.

An example of the run-level-decoding with respect to the [run, level] symbols will be described in more detail with reference to the timing diagrams shown in FIGS. 4A through 4E.

Examples of the [run, level] symbols stored in the second FIFO memory 37 are shown as [5, 3], [3, 2], [2, −1], . . . , [3, 2], [2, −1], . . . in FIG. 4A. If the second FIFO memory 37 becomes full when the [run, level] symbol [2, −1] is input, the second FIFO memory 37 outputs a fullness signal (/FULL) indicating that it is full of data, to the sequence controller 33, in the form of a low level as shown in FIG. 4B. Then, the sequence controller 33 outputs the low-level HOLD signal shown in FIG. 4C to the bitstream interfacer 12 and the barrel shifter 14. As a result, the barrel shifter 14 does not output the variable length coded data and does not generate a [run, level] symbol during the time when the low-level HOLD signal is applied thereto.

The [run, level] decoder 38 run-level-decodes the [run, level] symbols output from the second FIFO memory 37. By the run level decoding, each [run, level] symbol is changed into the data zeros corresponding to the runlength and the following level. For example, the symbol [5, 3] is changed into the data of five zeros and the following level value of 3, as shown in FIG. 4D. The run-level decoding with respect to the [run, level] symbols is performed in the same manner with respect to the symbols [3, 2], [2, −1], . . . , [2, 1] following the symbols [5, 3], whose result is shown in FIG. 4D.

When the EMPTY signal is applied from the second FIFO memory 37, that is, at a point of time when an operation interval of the [run, level] decoder 38 lapses, the second FIFO memory 37 does not output the [run, level] symbol. The [run, level] decoder 38 does not perform the run-level decoding operation either. Such a holding interval whose example is shown in FIG. 4D, is due to the additional information added to the actual video data according to the data coding standard.

When the EMPTY signal is changed into a high-level state, the [run, level] decoder 38 resumes the run-level decoding operation with respect to the [run, level] symbols supplied from the second FIFO memory 37. The data obtained by the run-level decoding is supplied to the block memory 39.

According to the MPEG (the Moving Picture Experts Group) in connection with the video standard, a block is composed of an 8×8 array of pixels. An inverse orthogonal transformer performs inverse orthogonal transformation in units of a block. Thus, the block memory 39 according to the embodiment of the present invention is designed to store at least two-block data. The block memory 39 has a double bank structure in which one-block data stored in one bank is output while run-level decoded data is stored in the other bank. The data stored in the block memory 39 is output to an inverse quantizer IQ (not shown) and an inverse discrete cosine transformer (IDCT) (not shown).

As described above, the high-speed variable length decoding apparatus according to the present invention independently generates a [run, level] symbol and decodes the [run, level] symbol, to thereby variable length decode the variable length coded data at high frequency for signal processing. Thus, the high-speed variable length decoding apparatus can be applied to a high-speed decoding system such as an HDTV system. Also, since the run-level decoded data can be stored in units of a block, a FIFO memory for storing the [run, level] symbols can be embodied in a small data capacity and can be manufactured using an application specific integrated circuit (ASIC).

While only certain embodiments of the invention have been specifically described herein, it will be apparent that numerous modifications may be made thereto without departing from the spirit and scope of the invention.

What is claimed is:

1. A variable length decoding apparatus for decoding variable length coded data, the variable length decoding apparatus comprising:

a storage and output portion for storing the variable length coded data and outputting the stored variable length coded data by a predetermined data amount in response to a data storage state signal, wherein said storage and output portion accepts the variable length coded data regardless of the state of said data storage state signal;

a run-level table for outputting a run-level symbol which is determined by the stored variable length coded data output from said storage and output portion;

a memory for storing and outputting the run-level symbol output from said run-level table, in a first-in-first-out manner, and generating the data storage state signal which indicates a data storage state of said memory; and a run-level decoder for generating run-level decoded data by run-level decoding the run-level symbol output from said memory.

2. The variable length decoding apparatus according to claim 1, wherein said storage and output portion stops the outputting of the stored variable length coded data if the data storage state signal indicates that said memory is full.

3. A variable length decoding apparatus for decoding variable length coded data, the variable length decoding apparatus comprising:

a storage and output portion for storing the variable length coded data and outputting the stored variable length coded data by a predetermined data amount in response to a data storage state signal;

a run-level table for outputting a run-level symbol which is determined by the stored variable length coded data output from said storage and output portion;

a memory for storing and outputting the run-level symbol output from said run-level table, in a first-in-first-out manner, and generating the data storage state signal which indicates a data storage state of said memory; and a run-level decoder for generating run-level decoded data by run-level decoding the run-level symbol output from said memory, wherein said memory generates an empty signal indicating that there is no stored data therein, and said run-level decoder stops the run-level decoding operation in response to the empty signal.

4. A variable length decoding apparatus for decoding variable length coded data, the variable length decoding apparatus comprising:

a storage and output portion for storing the variable length coded data and outputting the stored variable length coded data by a predetermined data amount in response to a data storage state signal, wherein said storage and output portion accepts the variable length coded data regardless of the state of said data storage state signal;

a run-level table for outputting a run-level symbol which is determined by the stored variable length coded data output from said storage and output portion;

a memory for storing and outputting the run-level symbol output from said run-level table, in a first-in-first-out manner, and generating the data storage state signal which indicates a data storage state of said memory;

a run-level decoder for generating run-level decoded data by run-level decoding the run-level symbol output from said memory; and a memory means for storing and outputting the run-level decoded data generated by said run-level decoder in units of a data block of a predetermined size.

5. The variable length decoding apparatus according to claim 4, wherein said memory means alternately stores and outputs the run-level decoded data in units of the data block.

6. The variable length decoding apparatus according to claim 4, wherein said data block is an 8×8 array of pixels.

7. The variable length decoding apparatus according to claim 4, wherein said memory means comprises at least two block memories for storing the run-level decoded data of each data block, and said block memories alternately stores and outputs the run-level decoded data.

8. The variable length decoding apparatus according to claim 7, wherein said data block is an 8×8 array of pixels.

9. The variable length decoding apparatus according to claim 1, wherein said storage and memory means further comprises a memory means for inputting, storing and outputting variable length coded data that inputs and stores variable length coded data regardless of the state of the data storage state signal.

10. The variable length decoding apparatus according to claim 4, wherein said memory means for storing and outputting the run-level decoded data generated by said run-level decoder receives run-level decoded data directly from said run-level decoder.

* * * * *